(12) United States Patent
Arai

(10) Patent No.: US 7,919,399 B2
(45) Date of Patent: Apr. 5, 2011

(54) SEMICONDUCTOR DEVICE MANUFACTURING METHOD AND DISPLAY DEVICE

(75) Inventor: Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 212 days.

(21) Appl. No.: 12/101,574

(22) Filed: Apr. 11, 2008

(65) Prior Publication Data

US 2008/0258154 A1 Oct. 23, 2008

(30) Foreign Application Priority Data

Apr. 20, 2007 (JP) ................................. 2007-111793

(51) Int. Cl.
*H01L 21/20* (2006.01)
(52) U.S. Cl. ................. 438/487; 117/904; 257/E21.134
(58) Field of Classification Search .......... 438/487–490; 117/904; 257/E21.134; 427/553, 554
See application file for complete search history.

(56) References Cited

U.S. PATENT DOCUMENTS

| | | | |
|---|---|---|---|
| 6,809,013 B2 * | 10/2004 | Ito | 438/487 |
| 2001/0019863 A1 * | 9/2001 | Yang | 438/166 |
| 2002/0130279 A1 * | 9/2002 | Jain et al. | 250/494.1 |
| 2004/0119955 A1 * | 6/2004 | Tanaka | 355/51 |
| 2006/0166469 A1 * | 7/2006 | Nakayama et al. | 438/487 |

FOREIGN PATENT DOCUMENTS

| | | |
|---|---|---|
| JP | 2003-332235 | 11/2003 |
| JP | 2004-153150 | 5/2004 |

* cited by examiner

*Primary Examiner* — Kiesha R Bryant
*Assistant Examiner* — Mark W Tornow
(74) *Attorney, Agent, or Firm* — SNR Denton US LLP

(57) ABSTRACT

Disclosed herein is a semiconductor device manufacturing method for performing an annealing process of irradiating a semiconductor film on which element forming areas including thin film transistor forming areas are arranged in a two-dimensional pattern with energy beams using a plurality of irradiating optical systems, wherein in the annealing process, an area irradiated with the energy beams is divided into a single beam irradiated area irradiated by each of the plurality of irradiating optical systems with an energy beam singly and a boundary area situated between single beam irradiated areas adjacent to each other and irradiated by both of two irradiating optical systems performing beam irradiation of the single beam irradiated areas with energy beams.

5 Claims, 11 Drawing Sheets

; PA FIRST IRARADIATION PART

; PB SECOND IRRADIATION PART

SEMICONDUCTOR DEVICE MANUFACTURING METHOD AND DISPLAY DEVICE

CROSS REFERENCES TO RELATED APPLICATIONS

The present invention contains subject matter related to Japanese Patent Application JP 2007-111793 filed in the Japan Patent Office on Apr. 20, 2007, the entire contents of which being incorporated herein by reference.

BACKGROUND OF THE INVENTION

1. Field of the Invention

The present invention relates to a semiconductor device manufacturing method suitable for manufacturing a thin film transistor (hereinafter abbreviated to a "TFT") substrate used in for example a liquid crystal display device or an organic electroluminescent device, and a display device including a semiconductor film manufactured by the method.

2. Description of the Related Art

When a high-value-added active matrix type liquid crystal display device referred to as a system liquid crystal, an organic electroluminescent display device (hereinafter referred to as an "organic EL display device") using an organic electroluminescent element (hereinafter referred to as an "organic EL element"), or the like is formed, a TFT substrate with crystalline silicon is generally used. This TFT substrate is generally made by forming an amorphous semiconductor film or a polycrystalline semiconductor film with a relatively small particle diameter on a substrate, performing an annealing process by irradiating the semiconductor film with a laser beam, and then forming a TFT as a driving element.

A low-cost and high-stability semiconductor laser may be used as a light source of a laser annealing apparatus (see Japanese Patent Laid-Open No. 2003-332235, for example). However, when a semiconductor laser is used, because of very small size of a beam spot, a scanning time per unit area is increased, thus inviting a decrease in productivity, an increase in manufacturing cost, and the like. It is accordingly proposed for higher throughput in the annealing process that a plurality of lasers are arranged in proximity to each other, and a plurality of parts of an amorphous semiconductor film are irradiated with a plurality of laser beams to thereby shorten the scanning time and increase productivity (see Japanese Patent Laid-Open No. 2004-153150, for example).

FIG. 14 shows an example of a pattern in which a substrate 310 is irradiated with a plurality of laser beams LB, for example three laser beams LB. On the substrate 310, a semiconductor film 320, for example, is formed, and three irradiation areas 311A, 311B, and 311C are set. Each of the laser beams LB is assigned to one of the three irradiation areas 311A, 311B, and 311C, and the laser beams LB are applied to the corresponding irradiation areas 311A, 311B, and 311C while scanned continuously in lines.

SUMMARY OF THE INVENTION

However, when a plurality of laser beams are used, as shown in FIG. 15A, for example, errors in adjustment of irradiating optical systems or the like may result in variations in laser output between the irradiating optical systems. The variations in laser output between the irradiating optical systems invite differences in crystal particle diameter between the irradiation areas 311A, 311B, and 311C in the semiconductor film after the annealing process, and thus become a factor in causing differences between the characteristics of TFTs fabricated in the respective irradiation areas 311A, 311B, and 311C. Hence, in a display device formed with such a TFT substrate, as shown in FIG. 15B, for example, differences in luminance between the irradiation areas 311A, 311B, and 311C occur, and boundary lines M between the irradiation areas 311A, 311B, and 311C may be visible as display nonuniformity. Also in a case where there are variations in beam shape between the irradiating optical systems, differences in crystal particle diameter between the irradiation areas occur, and display nonuniformity as described above may be visible. It is often difficult to eliminate these variations between the irradiating optical systems completely.

The present invention has been made in view of such problems. It is desirable to provide a semiconductor device manufacturing method that can suppress effects of variations in intensity between the laser beams of respective irradiating optical systems even when the plurality of irradiating optical systems are used to enhance productivity, and a display device that can suppress display nonuniformity and enhance display quality by being formed with a semiconductor device manufactured by the manufacturing method.

According to an embodiment of the present invention, there is provided a semiconductor device manufacturing method for performing an annealing process of irradiating a semiconductor film on which element forming areas including thin film transistor forming areas are arranged in a two-dimensional pattern with energy beams using a plurality of irradiating optical systems, wherein in the annealing process, an area irradiated with the energy beams is divided into a single beam irradiated area irradiated by each of the plurality of irradiating optical systems with an energy beam singly and a boundary area situated between single beam irradiated areas adjacent to each other and irradiated by both of two irradiating optical systems performing beam irradiation of the single beam irradiated areas with energy beams, the boundary area is divided into a first irradiation part as a part for beam irradiation by one of the two irradiating optical systems and a second irradiation part as a part for beam irradiation by the other of the two irradiating optical systems, and the first irradiation part, the second irradiation part, and the thin film transistor forming areas are arranged such that thin film transistor forming areas subjected to the beam irradiation by one of the two irradiating optical systems and thin film transistor forming areas subjected to the beam irradiation by the other of the two irradiating optical systems have a part where a thin film transistor forming area subjected to the beam irradiation by one of the two irradiating optical systems and a thin film transistor forming area subjected to the beam irradiation by the other of the two irradiating optical systems are mixed with each other in each of two-dimensional directions on the boundary area.

According to an embodiment of the present invention, there is provided a display device including: a driving substrate made by forming a semiconductor film on a substrate and forming thin film transistors on the semiconductor film; and display elements formed on the driving substrate; areas for forming the display elements including areas for forming the thin film transistors being arranged in a two-dimensional pattern on the semiconductor film in the driving substrate; wherein the semiconductor film is formed through an annealing process of irradiating the semiconductor film with energy beams using a plurality of irradiating optical systems, in the annealing process, an area irradiated with the energy beams is divided into a single beam irradiated area irradiated by each of the plurality of irradiating optical systems with an energy beam singly and a boundary area situated between single beam irradiated areas adjacent to each other and irradiated by both of two irradiating optical systems performing beam irradiation of the single beam irradiated areas with energy beams, the boundary area is divided into a first irradiation part as a part for beam irradiation by one of the two irradiating optical systems and a second irradiation part as a part for beam irradiation by the other of the two irradiating optical systems, and the first irradiation part, the second irradiation part, and the thin film transistor forming areas are arranged such that thin film transistor forming areas subjected to the beam irradiation by one of the two irradiating optical systems and thin film transistor forming areas subjected to the beam irradiation by the other of the two irradiating optical systems have a part where a thin film transistor forming area subjected to the beam irradiation by one of the two irradiating optical systems and a thin film transistor forming area subjected to the beam irradiation by the other of the two irradiating optical systems are mixed with each other in each of two-dimensional directions on the boundary area, and the semiconductor film is formed by performing beam irradiation using the plurality of irradiating optical systems.

According to the semiconductor device manufacturing method of the above-described procedure and the display device of the above-described constitution, a boundary area is irradiated with energy beams by respective irradiating optical systems performing beam irradiation of single beam irradiated areas next to the boundary area on both sides. In addition, beam irradiation by the irradiating optical systems is performed such that thin film transistor forming areas subjected to the beam irradiation by one of the two irradiating optical systems and thin film transistor forming areas subjected to the beam irradiation by the other of the two irradiating optical systems have a part where a thin film transistor forming area subjected to the beam irradiation by one of the two irradiating optical systems and a thin film transistor forming area subjected to the beam irradiation by the other of the two irradiating optical systems are mixed with each other in each of two-dimensional directions. Thus, even when there is a variation in energy beam intensity between the irradiating optical systems, difference in display luminance due to difference in crystal particle diameter which difference in crystal particle diameter occurs between the single beam irradiated areas is dispersed describing a two-dimensional pattern (for example a checkered pattern or a gradation form pattern) in which different display luminances are mixed with each other, rather than being on a single boundary line. Thus, a boundary resulting from a difference in energy intensity becomes less visible.

According to an embodiment of the present invention, even when an annealing process is performed on a semiconductor film by using a plurality of irradiating optical systems to thereby enhance the productivity of a semiconductor device, it is possible to suppress adverse effects of variations in energy beam intensity between the irradiating optical systems. Thus, when a display device is constructed with TFTs formed on the semiconductor film obtained through the annealing process, for example, it is possible to suppress display nonuniformity caused by difference in luminance and thereby achieve high display quality. This is effective especially when applied to an organic electroluminescent display device whose light emitting performance tends to be affected by difference in characteristics of TFTs.

DETAILED DESCRIPTION OF THE PREFERRED EMBODIMENTS

A semiconductor device manufacturing method and a display device according to embodiments of the present invention will hereinafter be described with reference to the drawings.

[General Constitution of Display Device]

A general constitution of a display device will first be described by taking an organic EL display device as an example.

Figure 1:
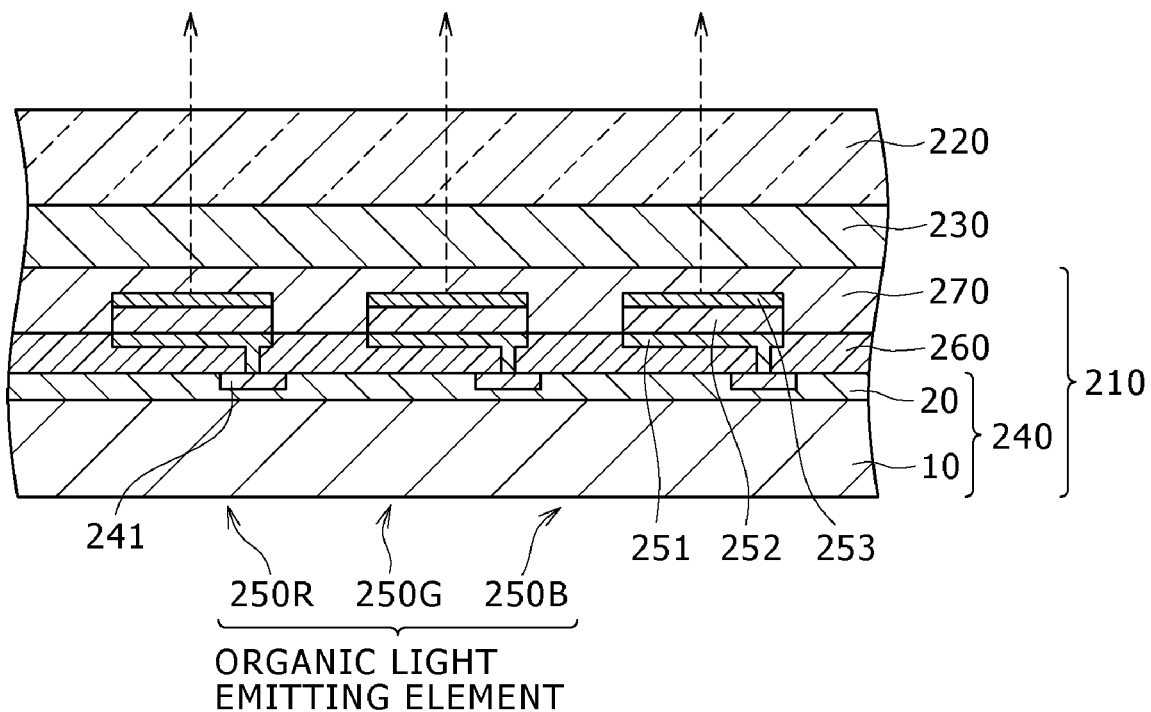
FIG. 1 is a diagram of assistance in explaining an example of a general constitution of an organic EL display device.

FIG. 1 is a diagram of assistance in explaining an example of a general constitution of an organic EL display device.

The display device shown in FIG. 1 is used as an active or passive type very thin organic EL display device driven by a TFT, for example. The display device is formed by arranging a driving panel 210 and a sealing panel 220 such that the driving panel 210 and the sealing panel 220 are opposed to each other, and laminating the driving panel 210 and the sealing panel 220 to each other with an adhesive layer 230 formed by a thermosetting resin or an ultraviolet curing resin interposed between the driving panel 210 and the sealing panel 220.

The driving panel 210 is formed by two-dimensional pattern arrangement of an organic EL element 250R emitting red light, an organic EL element 250G emitting green light, and an organic EL element 250B emitting blue light in the form of a matrix on a driving substrate 240.

The driving substrate 240 is made by forming a semiconductor film 20 on a substrate 10 and further forming a TFT 241 on the semiconductor film 20. That is, the driving substrate 240 functions as a so-called TFT substrate.

The TFT 241 is an active element corresponding to each of the organic EL elements 250R, 250G, and 250B. The TFT 241 has a gate electrode (not shown) connected to a scanning circuit not shown in the figure, and has a source and a drain (neither is shown) connected to wiring as a signal line provided via an interlayer insulating film (neither is shown) formed by silicon oxide, silicon nitride, or PGS (Phospho-Silicate Glass), for example. Incidentally, the constitution of the TFT 241 is not specifically limited, and may be a bottom gate type or a top gate type, for example.

The organic EL element 250R, 250G, or 250B is formed on the driving substrate 240 by laminating a first electrode 251 as an anode, an organic layer 252 including a light emitting layer, and a second electrode 253 as a cathode in order from the side of the driving substrate 240 with a covering layer 260 interposed between the driving substrate 240 and the part of the first electrode 251, the organic layer 252, and the second electrode 253. The organic EL elements 250R, 250G, and 250B are covered by a protective film 270 formed by silicon nitride, silicon oxide, resin, or the like to be shielded from the air as demanded.

The covering layer 260 has a thickness of about 0.2 μm to 50 μm, for example. The covering layer 260 is formed by an organic photosensitive material such as polyimide, polyamide, acrylic, BCB (benzocyclobutene), polyimideamide, or the like.

The first electrode 251 also has a function of a reflective layer. The first electrode 251 is for example made of a metal such as platinum (Pt), gold (Au), silver (Ag), chromium (Cr), aluminum (Al), tungsten (W) or the like, or an alloy thereof. Incidentally, the first electrode 251 is connected to the TFT 241 via a contact hole (not shown) provided in the covering layer 260.

The organic layer 252 has a different constitution depending on the light emission color of the organic EL element. The organic EL elements 250R and 250B have a structure formed by laminating a hole transporting layer, a light emitting layer, and an electron transporting layer in this order from the side of the first electrode 251. The organic EL element 250G has a structure formed by laminating a hole transporting layer and a light emitting layer in this order from the side of the first electrode 251. The hole transporting layer is to enhance efficiency of hole injection into the light emitting layer. The light emitting layer emits light by being injected with an electric current. The electron transporting layer is to enhance efficiency of electron injection into the light emitting layer. For the organic EL element 250R, a material forming the hole transporting layer include bis[(N-naphthyl)-N-phenyl]benzidine (α-NPD), a material forming the light emitting layer include 2,5-bis[4-[N-(4-methoxyphenyl)-N-phenylamino]] styrylbenzene-1,4-dicarbonitrile (BSB), and a material forming the electron transporting layer include an 8-quinolinol aluminum complex (Alq3). For the organic EL element 250B, a material forming the hole transporting layer include α-NPD, a material forming the light emitting layer include 4,4-bis(2,2-diphenylvinyl)biphenyl (DPVBi), and a material forming the electron transporting layer include Alq3. For the organic EL element 250G, a material forming the hole transporting layer include α-NPD, and a material forming the light emitting layer include Alq3 mixed with 1% by volume of Coumarin6 (C6).

The second electrode 253 is formed by a semi-transparent electrode. Light emitted from the light emitting layer is extracted from the side of the second electrode 253. The second electrode 253 is for example made of a metal such as Ag, Al, magnesium (Mg), calcium (Ca), sodium (Na) or the like, or an alloy thereof.

The sealing panel 220, which is opposed to the thus formed driving panel 210 with the adhesive layer 230 interposed between the sealing panel 220 and the driving panel 210, is positioned on the side of the organic EL elements 250R, 250G, and 250B of the driving panel 210. The sealing panel 220, together with the adhesive layer 230, seals the organic EL elements 250R, 250G, and 250B. However, the sealing panel 220 is formed by a light transmitting material such as a transparent glass that transmits light produced by the organic EL elements 250R, 250G, and 250B. In addition, a color filter (not shown), for example, is provided on the sealing panel 220. The color filter extracts the light produced by the organic EL elements 250R, 250G, and 250B, and absorbs external light reflected by the organic EL elements 250R, 250G, and 250B and wiring between the organic EL elements 250R, 250G, and 250B so as to improve contrast.

In the organic EL display device having the above-described constitution, when a predetermined voltage is applied between the first electrode 251 and the second electrode 253, a current is injected into the light emitting layer of the organic layer 252, and holes and electrons are recombined to emit light. This light passes through the second electrode 253, the protective film 270, and the sealing panel 220 to be extracted.

That is, in the organic EL display device, the light produced by each of the organic EL elements 250R, 250G, and 250B arranged by two-dimensional pattern arrangement in the form of a matrix is taken out to the outside, whereby each of the organic EL elements 250R, 250G, and 250B functions as one pixel. Thus image display output is performed.

[Each Pixel Area in Display Device]

As described above, for image display output, the organic EL display device has the organic EL elements 250R, 250G, and 250B arranged by two-dimensional pattern arrangement in the form of a matrix, the organic EL elements 250R, 250G, and 250B corresponding to the respective colors of red (R), green (G), and blue (B), and further includes the TFT 241 as an active element for each of the organic EL elements 250R, 250G, and 250B. Thus, on the driving substrate 240, TFTs 241 are also arranged by two-dimensional pattern arrangement in the form of a matrix in such a manner as to correspond to the arrangement of the organic EL elements 250R, 250G, and 250B. That is, one TFT 241 is disposed around one pixel area (=element forming area) in which one of the organic EL elements 250R, 250G, and 250B for the respective colors is disposed.

Figure 2:
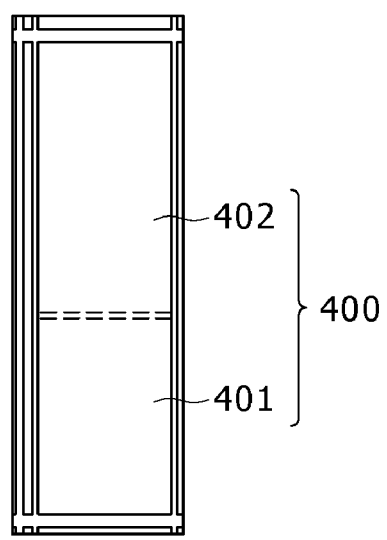
FIG. 2 is a plan view of one concrete example of an element forming area.

FIG. 2 is a plan view of one concrete example of an element forming area.

As shown in FIG. 2, there is a TFT forming area 401 within an element forming area 400 corresponding to one pixel area on the driving substrate 240, or the semiconductor film 20 formed on the substrate 10 to be more exact. The TFT forming area 401 is an area where the TFT 241 is formed.

However, there is also a capacitance forming area 402 in addition to the TFT forming area 401 within one element forming area 400. The capacitance forming area 402 is an area in which circuit component parts such as a capacitance (not shown) necessary to drive the organic EL elements 250R, 250G, and 250B are formed. Incidentally, it suffices to form the circuit component parts including the capacitance formed in the capacitance forming area 402 by using publicly known technology, and thus detailed description of the circuit component parts will be omitted.

[Procedure for Manufacturing Display Device]

A procedure for manufacturing the organic EL display device having the above-described constitution will next be described. The organic EL display device may be manufactured by the following procedure, for example.

First, the TFT 241 is formed using the semiconductor film 20 formed on the substrate 10, and wiring or the like electrically connected to the TFT 241 is formed, whereby the driving substrate 240 is made.

Next, the covering layer 260 having the above-described thickness is formed by coating, exposing, and developing the above-described material, for example, by a spin coating method, for example.

Then, on the covering layer 260, a film for the first electrode 251 which film is made of the above-described material is formed by for example a sputtering method, and selectively etched by for example a lithography technique to be patterned into a predetermined shape. Thereafter, the organic layer 252 and the second electrode 253 made of the above-described materials are sequentially formed by for example an evaporation method, whereby the organic EL elements 250R, 250G, and 250B are formed. Thus the driving panel 210 is made.

Thereafter, the organic EL elements 250R, 250G, and 250B are covered by the protective film 270 made of the above-described material, and further the adhesive layer 230 is formed on the protective film 270. Then, the sealing panel 220 provided with a color filter as demanded is prepared, and the driving panel 210 and the sealing panel 220 are laminated to each other with the adhesive layer 230 between the driving panel 210 and the sealing panel 220.

As a result of performing the above procedure, the organic EL display device shown in FIG. 1 is completed.

[Semiconductor Device Manufacturing Method]

A procedure for manufacturing the driving substrate 240 in the procedure for manufacturing the organic EL display device will be described in more detail. The procedure for manufacturing the driving substrate 240 corresponds to one concrete example of a semiconductor device manufacturing method according to an embodiment of the present invention.

Figure 3:
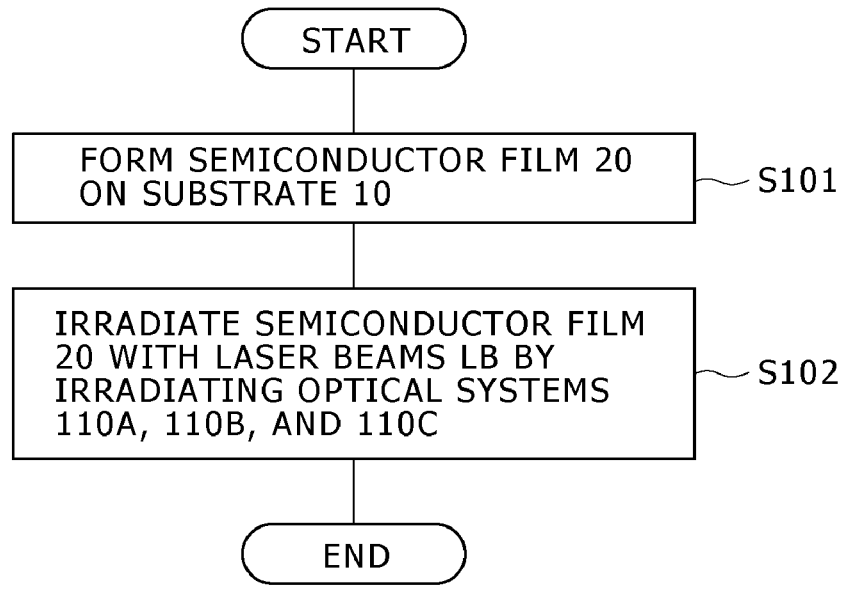
FIG. 3 is a flowchart representing a general flow of a procedure for manufacturing a driving substrate, which procedure is one concrete example of a semiconductor device manufacturing method according to an embodiment of the present invention.

FIG. 3 is a flowchart representing a general flow of the procedure for manufacturing the driving substrate, which procedure is one concrete example of a semiconductor device manufacturing method according to an embodiment of the present invention.

As shown in FIG. 3, the procedure for manufacturing the driving substrate 240 includes: a film forming step (step 101 (a step will hereinafter be abbreviated to "S")) of forming the semiconductor film 20 on the substrate 10; and an annealing step (S102) of modifying the semiconductor film 20 by irradiating the semiconductor film 20 with a laser beam, for example, as an energy beam.

Figure 4:
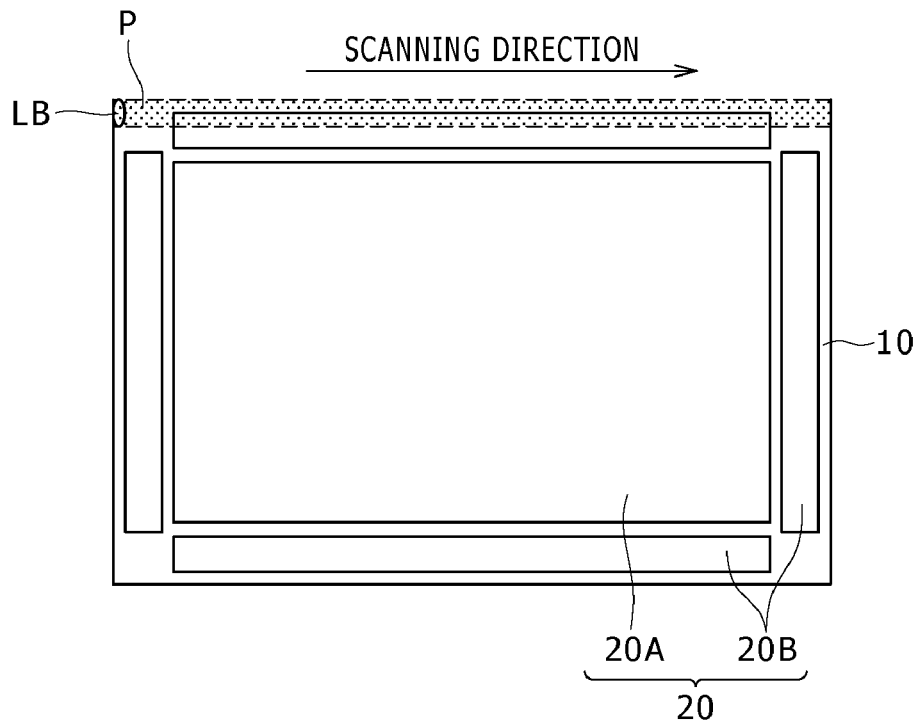
FIG. 4 is a plan view of assistance in explaining a film forming step.

FIG. 4 is a plan view of assistance in explaining the film forming step.

As shown in FIG. 4, in the film forming step, the semiconductor film 20 having a thickness of 50 nm and made of amorphous silicon (Si) or polycrystalline silicon with a relatively small particle diameter is formed on the substrate 10 in a rectangular shape (an oblong shape, for example) which substrate is made of an insulating material such as a glass or the like. While the planar shape of the semiconductor film 20 is not specifically limited, suppose that in the case of the driving substrate 240 for the display device, for example, the semiconductor film 20 includes an area 20A intended for formation of a pixel part, the area 20A being formed in a central part of the substrate 10, and an area 20B intended for formation of a driving circuit, an electrostatic breakdown protection circuit, lead wiring, and a lead pad section, the area 20B being formed in the form of bands on the periphery of the area 20A.

After the semiconductor film 20 is formed on the substrate 10, the semiconductor film 20 is irradiated with a laser beam LB to crystallize the semiconductor film 20 in an annealing process.

Figure 5:
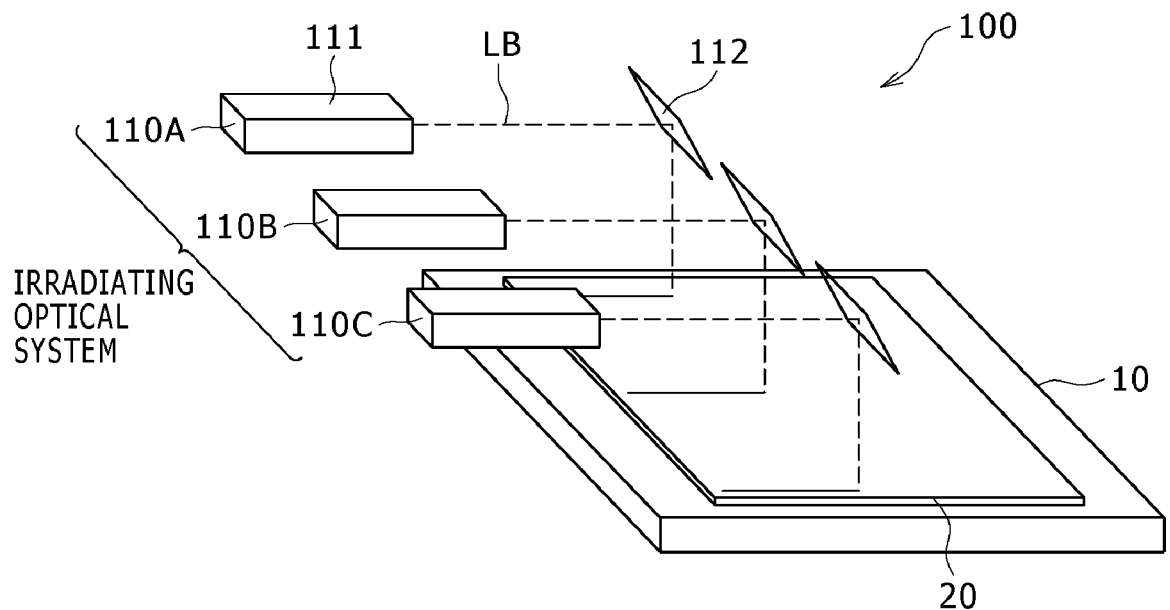
FIG. 5 is a diagram of assistance in explaining an example of a laser annealing apparatus used in an annealing process.

FIG. 5 is a diagram of assistance in explaining an example of a laser annealing apparatus used in the annealing process. The laser annealing apparatus shown in FIG. 5 has a plurality of irradiating optical systems, for example three irradiating optical systems 110A, 110B, and 110C, and is able to simultaneously irradiate three different parts of the semiconductor film 20 on the substrate 10 with laser beams LB from the irradiating optical systems 110A to 110C. Each of the irradiating optical systems 110A to 110C for example includes: a laser generating source 111 for generating the laser beam LB; and a mirror 112 for changing the traveling direction of the laser beam LB from the laser generating source 111 toward the substrate 10.

Figure 6:
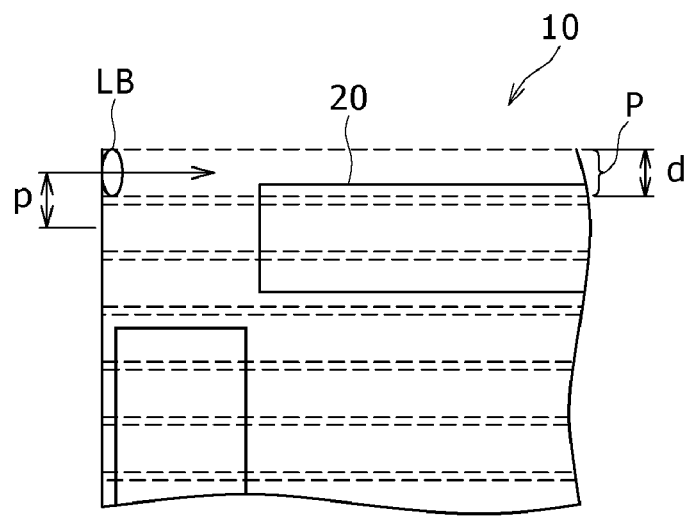
FIG. 6 is a plan view showing an example of a pattern of scanning of a laser beam by the laser annealing apparatus of FIG. 5.

FIG. 6 is a plan view showing an example of a pattern of scanning of the laser beam by the laser annealing apparatus of FIG. 5. As shown in FIG. 6, the laser beam LB from each of the irradiating optical systems 110A to 110C forms a large number of parallel line patterns P close to each other, the patterns P having an annealing width (a maximum spot diameter of the laser beam LB) d and a pitch p. The laser beam LB is generally applied while scanned in a direction parallel to a longer side of the substrate 10. Incidentally, it is desirable that the pitch p of the parallel line patterns P be adjusted to a pixel pitch, and supposed that the annealing width d is p/2 or less.

Figure 7:
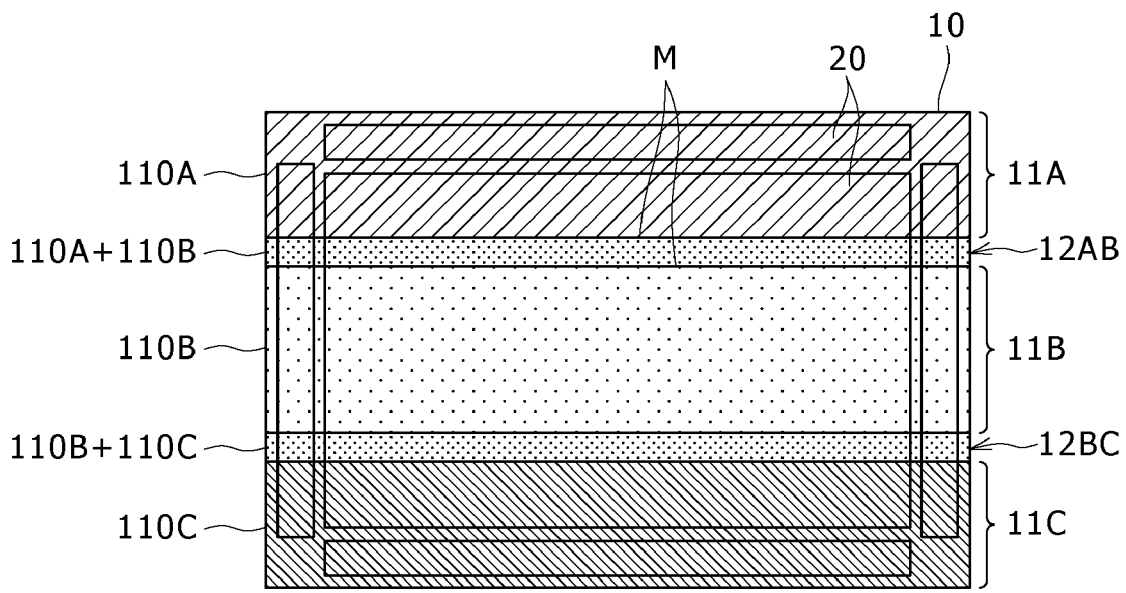
FIG. 7 is a plan view of an example of areas irradiated with laser beams by the laser annealing apparatus of FIG. 5.

FIG. 7 is a plan view of an example of areas irradiated with the laser beams by the laser annealing apparatus of FIG. 5. As shown in FIG. 7, in the annealing process, the substrate 10 is divided by boundary lines M parallel to the parallel line patterns P into a plurality of single beam irradiated areas, for example three single beam irradiated areas (hereinafter referred to simply as "single areas") 11A, 11B, and 11C, a boundary area 12AB between the single areas 11A and 11B, and a boundary area 12BC between the single areas 11B and 11C. The irradiating optical system 110A irradiates the single area 11A with the laser beam LB, the irradiating optical system 110B irradiates the single area 11B with the laser beam LB, and the irradiating optical system 110C irradiates the single area 11C with the laser beam LB. The irradiating optical systems 110A and 110B irradiate the boundary area 12AB with the laser beam LB, and the irradiating optical systems 110B and 110C irradiate the boundary area 12BC with the laser beam LB. That is, the area irradiated with the laser beams LB is divided into the single areas 11A, 11B, and 11C in which the respective irradiating optical systems 110A to 110C perform beam irradiation singly and the boundary areas 12AB and 12BC in which the two irradiating optical systems 110A and 110B or the two irradiating optical systems 110B and 110C perform beam irradiation while the laser beams LB of the two irradiating optical systems 110A and 110B or the two irradiating optical systems 110B and 110C are mixed with each other by a certain rule in each irradiated line.

Thereby, in the annealing process, the use of the three irradiating optical systems 110A to 110C can shorten a scanning time and enhance productivity.

In addition, the boundary areas 12AB and 12BC in which two of the irradiating optical systems 110A to 110C perform beam irradiation are provided between the single areas 11A, 11B, and 11C. Thus, even when there are variations in intensity between the laser beams LB of the irradiating optical systems 110A to 110C, it is possible to alleviate visibility of difference in display luminance which difference results from difference in crystal particle diameter due to the intensity variations.

In the case of forming the organic EL display device, however, intervals between pixel areas can be for example 0.3 mm or more. In this case, in the boundary areas 12AB and 12BC, when the laser beams LB are mixed with each other by a certain rule in each irradiated line, luminance differences in the form of a line may become visible.

Accordingly, in irradiating the boundary areas 12AB and 12BC with the laser beams LB, the irradiation is performed as follows.

For example, directing attention to the boundary area 12AB, the boundary area 12AB is irradiated with the laser beams LB using the two irradiating optical systems 110A and 110B, and at the time of the irradiation, the boundary area 12AB is divided into a first irradiation part, which is a part to be subjected to beam irradiation by one irradiating optical system 110A, and a second irradiation part, which is a part to be subjected to beam irradiation by the other irradiating optical system 110B. Then, the first irradiation part and the second irradiation part are arranged into a pattern while positional relation with TFT forming areas 401 is taken into consideration such that TFT forming areas 401 on the semiconductor film 20 which areas are subjected to beam irradiation by the irradiating optical system 110A and TFT forming areas 401 on the semiconductor film 20 which areas are subjected to beam irradiation by the irradiating optical system 110B have a part where a TFT forming area 401 on the semiconductor film 20 which area is subjected to beam irradiation by the irradiating optical system 110A and a TFT forming area 401 on the semiconductor film 20 which area is subjected to beam irradiation by the irradiating optical system 110B are mixed with each other in each of two-dimensional directions on the boundary area 12AB.

This is exactly the same with the boundary area 12BC.

Thus, in each of the boundary areas 12AB and 12BC, even when there are variations in intensity between the laser beams LB of the irradiating optical systems 110A to 110C, a difference in display luminance due to difference in crystal particle diameter is dispersed describing a two-dimensional pattern (for example a checkered pattern or a gradation form pattern) rather than being on a single boundary line. Thus, a boundary resulting from a difference in energy intensity becomes less visible, and this method is very effective especially when intervals between pixel areas are for example 0.3 mm or more.
[First Concrete Example of Pattern Division]

A pattern arrangement (pattern division) of the first irradiation part and the second irradiation part will be described in the following by taking the boundary area 12AB interposed between the single areas 11A and 11B as an example.

Figure 8:
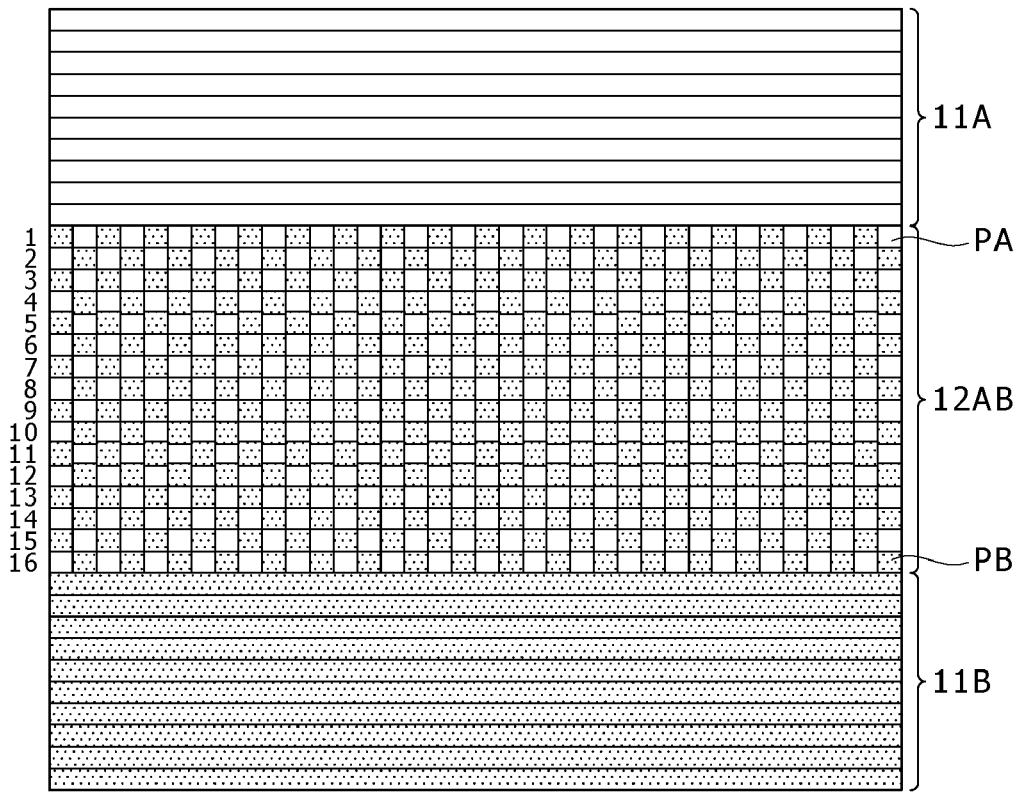
FIG. 8 is a diagram of assistance in explaining a first concrete example of pattern division of a first irradiation part and a second irradiation part.

FIG. 8 is a diagram of assistance in explaining a first concrete example of pattern division of the first irradiation part and the second irradiation part. As shown in FIG. 8, in the boundary area 12AB, first irradiation parts PA irradiated with the laser beam LB by the irradiating optical system 110A and second irradiation parts PB irradiated with the laser beam LB by the irradiating optical system 110B are arranged in such a manner as to be alternately mixed with each other in a single scanning line extending in a direction along boundary lines M between the single areas 11A and 11B and the boundary area 12AB. Further, first irradiation parts PA and second irradiation parts PB are also arranged in such a manner as to be alternately mixed with each other in a same line in a direction orthogonal to the scanning line. That is, the first irradiation parts PA and the second irradiation parts PB are arranged in such a manner as to be mixed with each other in a checkered pattern so that the first irradiation parts PA and the second irradiation parts PB have a part where first irradiation parts PA and second irradiation parts PB are mixed with each other in each of two-dimensional directions.

Such a pattern arrangement can be achieved by controlling the switching on/off of the irradiating optical systems 110A and 110B. That is, by switching the irradiation of the first irradiation parts PA and the second irradiation parts PB with each beam to an on/off state depending on main scanning positions and auxiliary scanning positions on scanning lines, TFT forming areas 401 on the semiconductor film 20 which areas are subjected to beam irradiation as first irradiation parts PA and TFT forming areas 401 on the semiconductor film 20 which areas are subjected to beam irradiation as second irradiation parts PB are mixed with each other in the form of a checkered pattern on the boundary area 12AB. Incidentally, it suffices to perform on/off switching control of the beam irradiation by using publicly known technology, and thus description thereof will herein be omitted.

The above-described pattern arrangement can also be achieved by shielding/non-shielding switching control on the respective laser beams LB from the irradiating optical systems 110A and 110B. Specifically, for example, a mask is disposed between each of the irradiating optical systems 110A and 110B and the semiconductor film 20 to be irradiated with the beams, and switching is performed using the mask to shield or transmit the respective laser beams LB from the irradiating optical systems 110A and 110B. Thereby TFT forming areas 401 on the semiconductor film 20 which areas are subjected to beam irradiation as first irradiation parts PA and TFT forming areas 401 on the semiconductor film 20 which areas are subjected to beam irradiation as second irradiation parts PB are mixed with each other in the form of a checkered pattern on the boundary area 12AB. Incidentally, the shielding/non-shielding switching control on the beam irradiation can be achieved by using a publicly known shutter mechanism as well as by using the mask. There is another method that prevents an object from being irradiated with energy by using reflection or refraction. That is, a method for the shielding/non-shielding switching control on the beam irradiation is not specifically limited.

Figure 9:
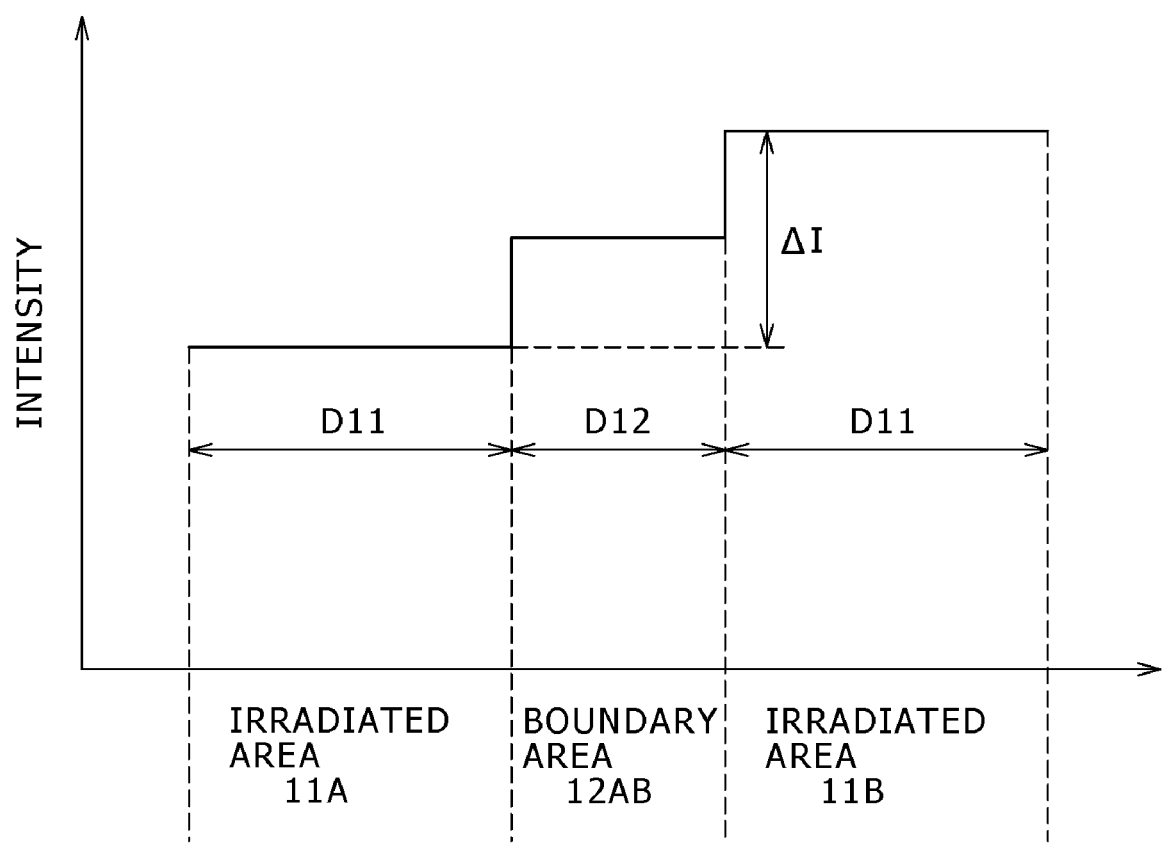
FIG. 9 is a diagram of assistance in explaining an example of energy intensity of the laser beams as a result of the pattern division in FIG. 8.

FIG. 9 is a diagram of assistance in explaining an example of energy intensity of the laser beams as a result of the pattern division in FIG. 8.

When the first irradiation parts PA and the second irradiation parts PB are mixed with each other in the form of a checkered pattern, as shown in FIG. 9, the average intensity of the laser beams LB with which the boundary area 12AB is irradiated is approximated to about the mean of intensities in the respective single areas 11A and 11B. This means that a difference in intensity between the laser beams LB of the single areas 11A and 11B is reduced by approximately half by the boundary area 12AB. That is, boundaries between the single areas 11A and 11B and the boundary area 12AB are made less visible through the reduction of the difference in intensity between the single areas 11A and 11B by the boundary area 12AB. Thus, when the driving substrate 240 is made by forming TFTs 241 on the semiconductor film 20 obtained through the above-described pattern division, it is possible to manufacture an organic EL display device that suppresses display nonuniformity caused by difference in luminance and thereby achieves high display quality.

Incidentally, the width D12 of the boundary area 12AB may be set according to the width D11 of the single areas 11A and 11B and the difference ΔI in intensity between the laser beams LB. Specifically, when the intensity difference ΔI is large, the width D12 of the boundary area 12AB is increased, for example.

In the case of creating the boundary areas 12AB and 12BC within the area 20A intended for formation of a pixel part in the semiconductor film 20, when pixels have a fixed repetitive structure in which the colors of R, G, and B are aligned in order, this repetitive structure may be treated as one unit within which unit the pattern division is not performed. This is because in a normal display element, one pixel is formed by sub-pixels of the three colors of R, G, and B, and chromaticity is defined by luminances from the three sub-pixels. More specifically, this is because if a laser beam of a higher intensity is used for R and a laser beam of a lower intensity is used for G and B within a same pixel, and when white is to be displayed, reddish white is displayed, whereas when laser beams of a same intensity are used within a same pixel, chromaticity is not changed even though luminance may be changed from that of an adjacent pixel.

[Second Concrete Example of Pattern Division]

A second concrete example of pattern arrangement (pattern division) of the first irradiation part and the second irradiation part will next be described. Also in this case, concrete description will be made by taking the boundary area 12AB as an example.

While the pattern division of the first irradiation parts PA and the second irradiation parts PB in the boundary area 12AB may be uniform as in the foregoing first concrete example, the distribution densities of the first irradiation parts PA and the second irradiation parts PB may be varied in a direction orthogonal to the boundaries between the single areas 11A and 11B and the boundary area 12AB in order to reduce the difference in beam intensity between the single areas 11A and 11B surely and effectively.

Figure 10A:
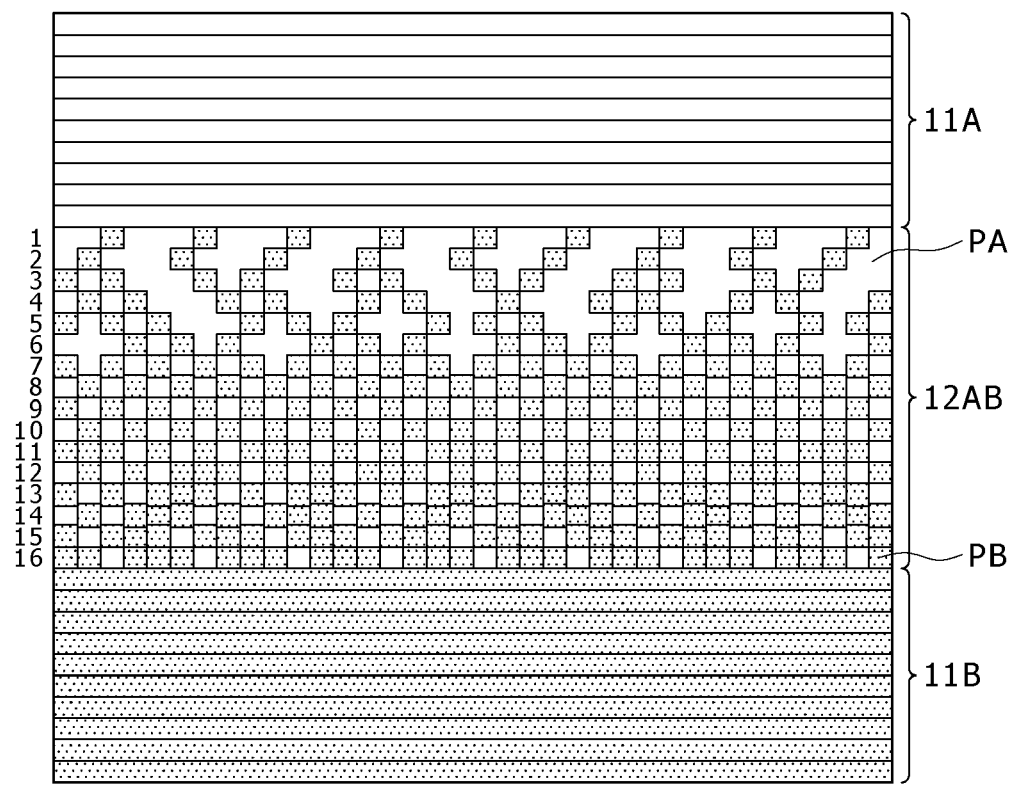
FIGS. 10A and 10B are diagrams of assistance in explaining a second concrete example of the pattern division of the first irradiation part and the second irradiation part.
Figure 10B:
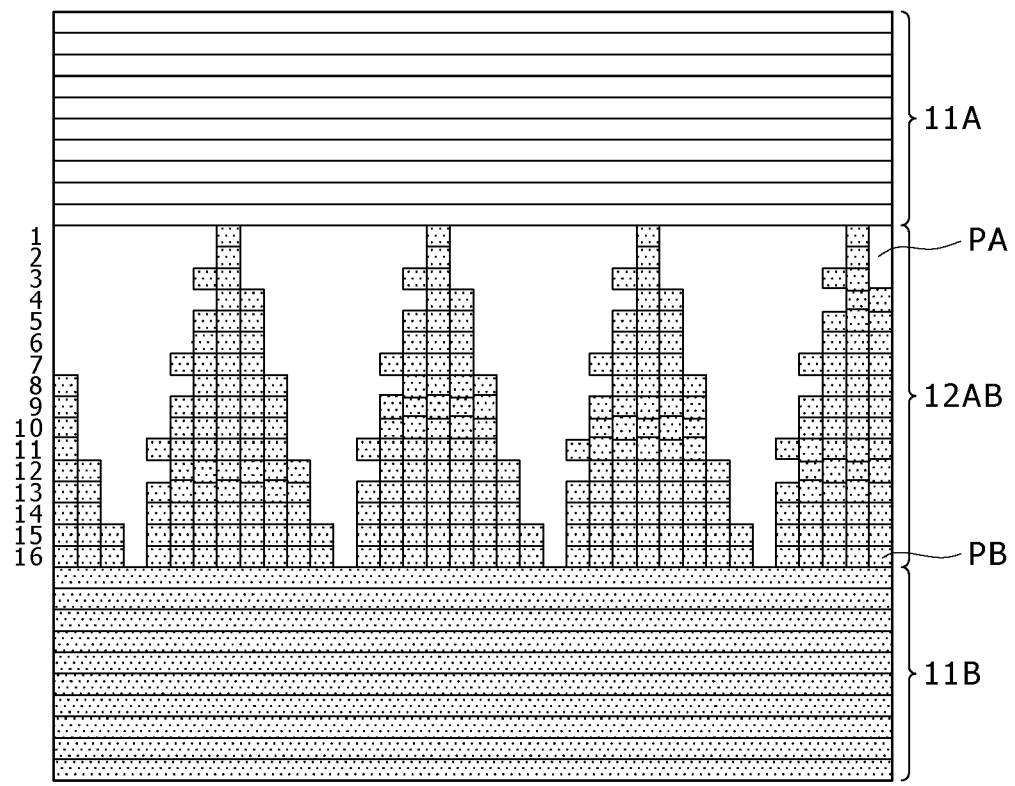

FIGS. 10A and 10B are diagrams of assistance in explaining a second concrete example of the pattern division of the first irradiation part and the second irradiation part. In each of pattern divisions shown in FIGS. 10A and 10B, the first irradiation parts PA and the second irradiation parts PB are arranged so as to be mixed with each other in a so-called gradation form, in which the respective distribution densities of the first irradiation parts PA and the second irradiation parts PB are gradually changed, or more specifically the distribution density of either the first irradiation parts PA or the second irradiation parts PB gradually becomes higher and the other distribution density gradually becomes lower from one side of the single area 11A to another side of the single area 11B in the boundary area 12AB. Thereby the first irradiation parts PA and the second irradiation parts PB are divided into a pattern such that the first irradiation parts PA and the second irradiation parts PB have a part where first irradiation parts PA and second irradiation parts PB are mixed with each other in each of two-dimensional directions in the boundary area 12AB. However, it suffices for the first irradiation parts PA and the second irradiation parts PB to have a part where first irradiation parts PA and second irradiation parts PB are mixed with each other, and as shown in FIG. 10B, for example, there may be a line where first irradiation parts PA and second irradiation parts PB are not mixed with each other (a line formed by either only first irradiation parts PA or only second irradiation parts PB).

As in the foregoing first concrete example, such a pattern arrangement can be achieved by on/off switching control on the irradiating optical systems 110A and 110B or shielding/non-shielding switching control on the respective laser beams LB from the irradiating optical systems 110A and 110B.

Figure 11:
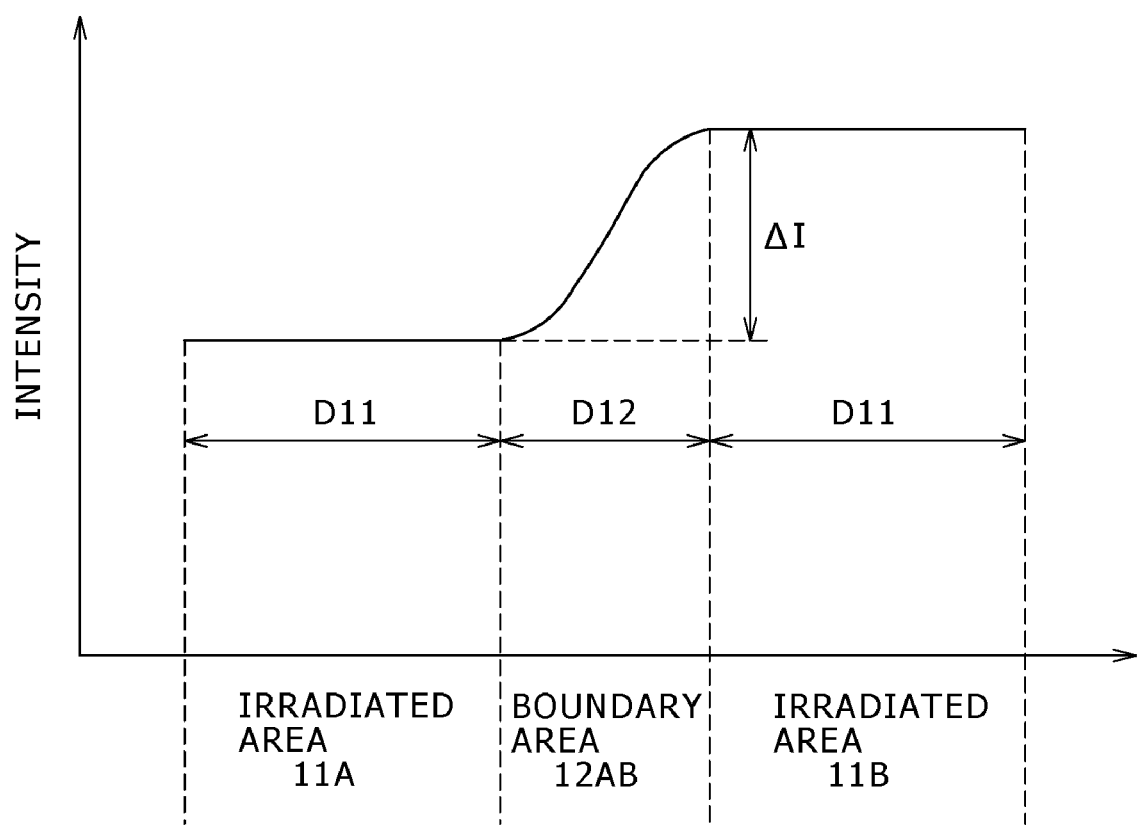
FIG. 11 is a diagram of assistance in explaining an example of energy intensity of the laser beams as a result of the pattern division in FIG. 10.

FIG. 11 is a diagram of assistance in explaining an example of energy intensity of the laser beams as a result of the pattern division in FIG. 10.

When the first irradiation parts PA and the second irradiation parts PB are mixed with each other in the gradation form, as shown in FIG. 11, the intensity of the laser beams LB with which the boundary area 12AB is irradiated is approximated by a curve connecting intensities in the respective single areas 11A and 11B. This means that the intensities of the laser beams LB in the single areas 11A and 11B make a gradual transition in the boundary area 12AB and continuity of the intensities of the laser beams LB is maintained. That is, while the continuity of intensity between the single areas 11A and 11B is maintained by the boundary area 12AB, the intensity difference is alleviated two-dimensionally. As a result, boundaries between the single areas 11A and 11B and the boundary area 12AB are made less visible. Thus, when the driving substrate 240 is made by forming TFTs 241 on the semiconductor film 20 obtained through the above-described pattern division in the gradation form, it is possible to manufacture an organic EL display device that suppresses display nonuniformity caused by difference in luminance more than in the case of the checkered pattern and thereby achieves even higher display quality.

Incidentally, the pattern division in the gradation form is not specifically limited as long as display nonuniformity caused by difference in luminance is ergonomically less visible.

In addition, the setting of the width D12 of the boundary area 12AB according to the intensity difference ΔI, treating a repetitive structure of the colors of R, G, and B as one unit, and the like in the case of the pattern division in the gradation form are exactly the same as in the foregoing first concrete example.

[Third Concrete Example of Pattern Division]

A third concrete example of pattern arrangement (pattern division) of the first irradiation part and the second irradiation part will next be described. Also in this case, concrete description will be made by taking the boundary area 12AB as an example.

The first concrete example and the second concrete example of pattern division as described above demand realization of a constitution in which optical or electric on/off switching control on the irradiating optical systems 110A to 110C can be performed accurately in a very short time, or a light shield such as a mask or the like is placed between the irradiating optical systems 110A to 110C and the semiconductor film 20 to be irradiated, in order to make the first irradiation parts PA and the second irradiation parts PB dispersed describing a two-dimensional pattern such that first irradiation parts PA and second irradiation parts PB are mixed with each other in each of the two-dimensional directions. That is, the mechanism of the irradiating device for applying the laser beams LB or a mechanism attached thereto may become complex.

Accordingly, the third concrete example achieves the pattern division of the first irradiation parts PA and the second irradiation parts PB without demanding on/off switching control or shielding/non-shielding switching control on the laser beams LB, for example, by changing arrangement of TFT forming areas 401 in element forming areas 400.

Figure 12:
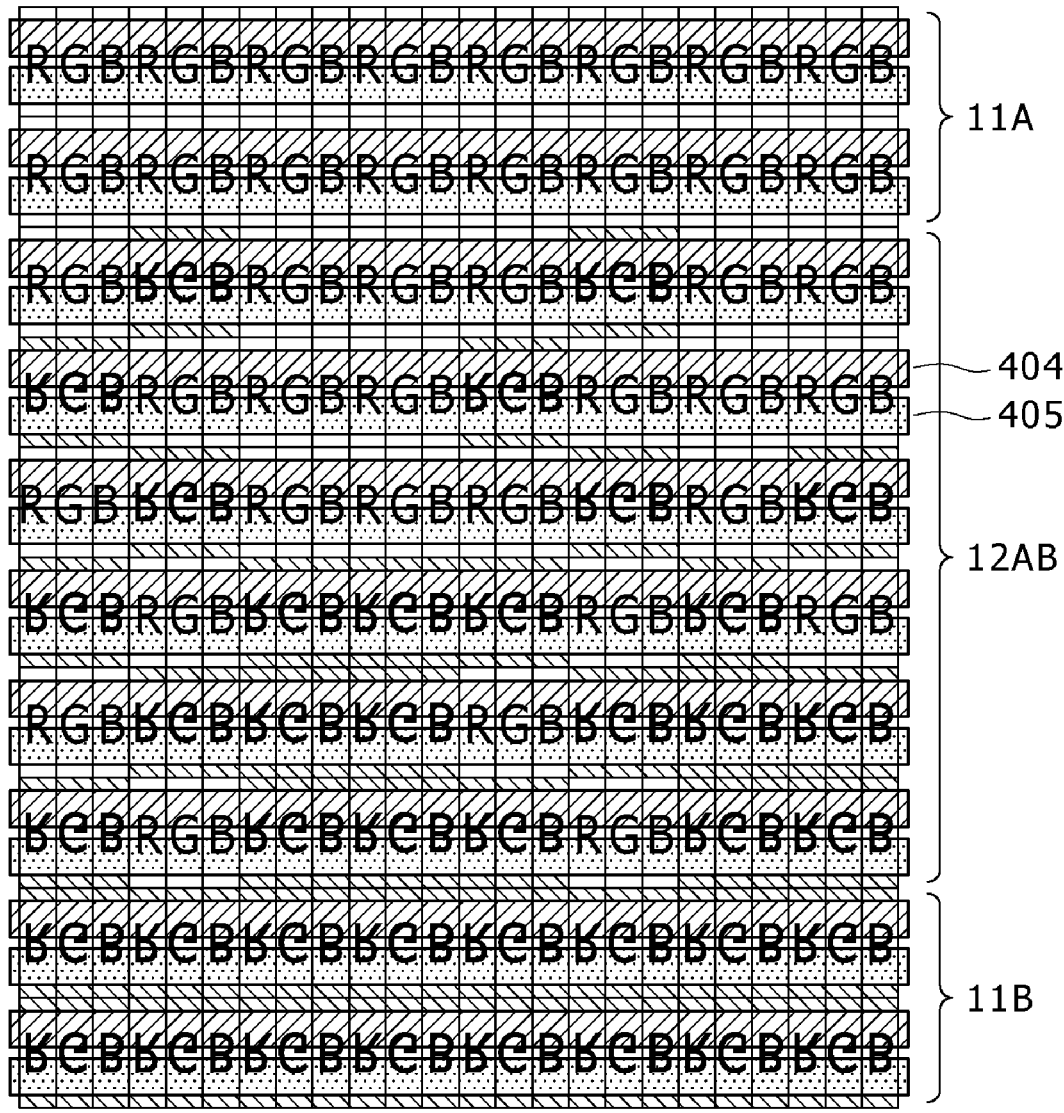
FIG. 12 is a diagram of assistance in explaining a third concrete example of the pattern division of the first irradiation part and the second irradiation part.
Figure 12:
Figure 12:
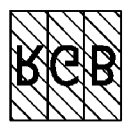

FIG. 12 is a diagram of assistance in explaining a third concrete example of the pattern division of the first irradiation part and the second irradiation part. When the pattern division as shown in FIG. 12 is performed, on/off switching control or shielding/non-shielding switching control on the laser beams LB, for example, as in the first concrete example or the second concrete example is not performed. However, beam irradiations from the two irradiating optical systems 110A and 110B used in the two single areas 11A and 11B adjacent to the boundary area 12AB are performed in parallel with each other. Specifically, an element forming area 400 is divided into a side of the single area 11A and a side of the single area 11B. One side (for example the side of the single area 11B) is set as a beam irradiation area 404 to be irradiated with a beam by the irradiating optical system 110A that irradiates the single area 11A with the beam, and the other side (for example the side of the single area 11A) is set as a beam irradiation area 405 to be irradiated with a beam by the irradiating optical system 110B that irradiates the single area 11B with the beam. The irradiating optical systems 110A and 110B apply the laser beams LB in parallel with each other, so that the beam irradiation areas 404 and 405 in the form of lines are arranged alongside of each other.

The element forming area 400 irradiated with the beams from the irradiating optical systems 110A and 110B in parallel with each other includes a TFT forming area 401 and a capacitance forming area 402. Of these areas, the TFT forming area 401 needs modification of the semiconductor film 20 by irradiation with the laser beam LB, but the capacitance forming area 402 does not particularly need modification of the semiconductor film 20 by irradiation with the laser beam LB. That is, it suffices to subject at least the TFT forming area 401 in the element forming area 400 to an annealing process by irradiation with the laser beam LB.

Thus, when irradiation with the beam from the irradiating optical system 110A and irradiation with the beam from the irradiating optical system 110B are performed in parallel with each other, TFT forming areas 401 in element forming areas 400 can be irradiated with the beams selectively by changing the arrangement of the TFT forming areas 401. For example, in a certain element forming area 400, a TFT forming area 401 and a capacitance forming area 402 are arranged such that the TFT forming area 401 is situated on the side of the single area 11B, and the irradiating optical system 110A irradiates the TFT forming area 401 with the beam. The TFT forming area 401 thereby belongs to the first irradiation part PA as a part subjected to beam irradiation by the irradiating optical system 110A. In another element forming area 400, a TFT forming area 401 and a capacitance forming area 402 are arranged such that the TFT forming area 401 is situated on the side of the single area 11A, and the irradiating optical system 110B irradiates the TFT forming area 401 with the beam. The TFT forming area 401 thereby belongs to the second irradiation part PB as a part subjected to beam irradiation by the irradiating optical system 110B. That is, by making the position of the TFT forming area 401 different in each element forming area 400, the boundary area 12AB is divided into first irradiation parts PA and second irradiation parts PB.

At this time, when the pixels have a fixed repetitive structure in which the colors of R, G, and B are aligned in order, this repetitive structure is treated as one unit, and the arrangement of the TFT forming areas 401 is changed according to a certain rule. The certain rule includes the form of a checkered pattern as described in the first concrete example, the form of a gradation pattern as described in the second concrete example, and the like. That is, the arrangement of a TFT forming area 401 in each element forming area 400 is changed in each unit according to the certain rule, whereby TFT forming areas 401 subjected to beam irradiation by the irradiating optical system 110A and TFT forming areas 401 subjected to beam irradiation by the irradiating optical system 110B are arranged so as to be mixed with each other in the form of a checkered pattern, the form of a gradation pattern, or the like.

Figure 13:
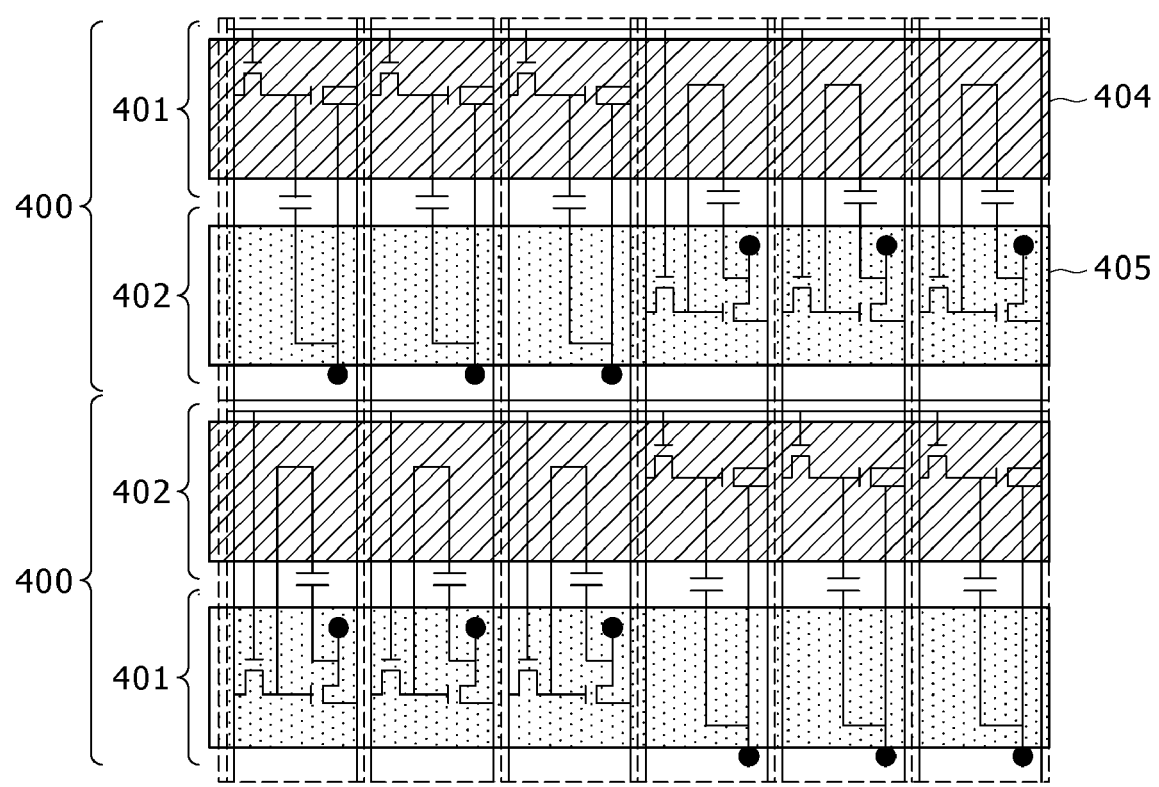
FIG. 13 is a diagram of assistance in explaining the third concrete example of the pattern division in more detail.
Figure 14:
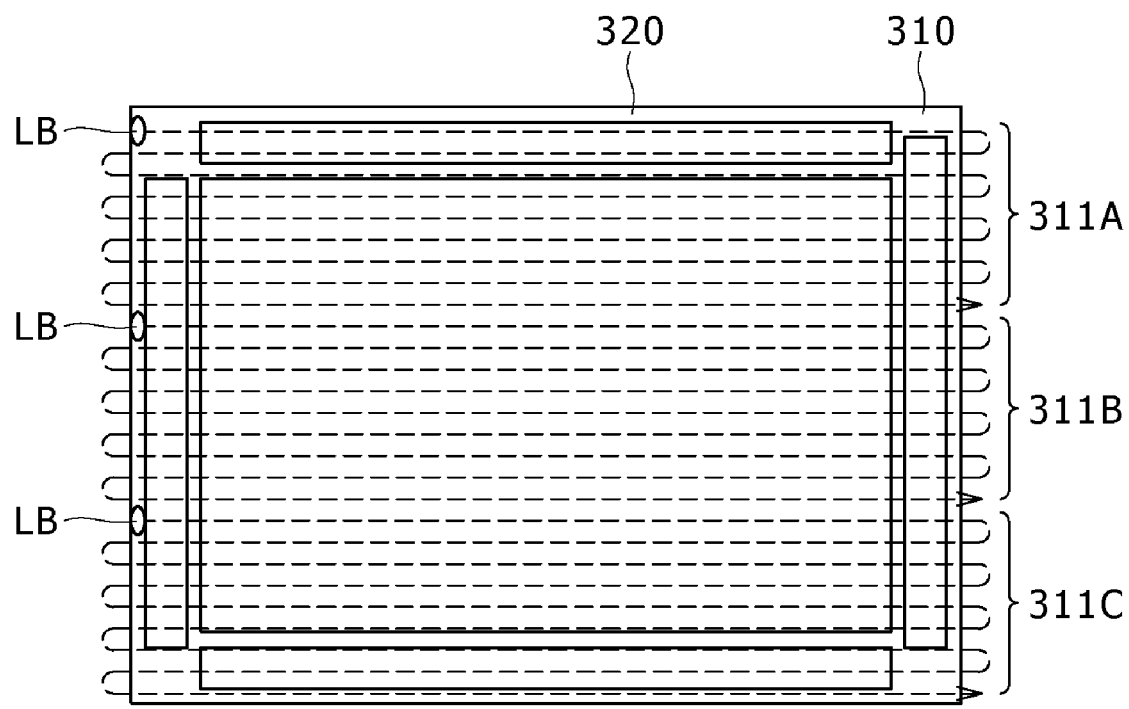
FIG. 14 is a diagram of assistance in explaining an existing laser annealing method.
Figure 15A:
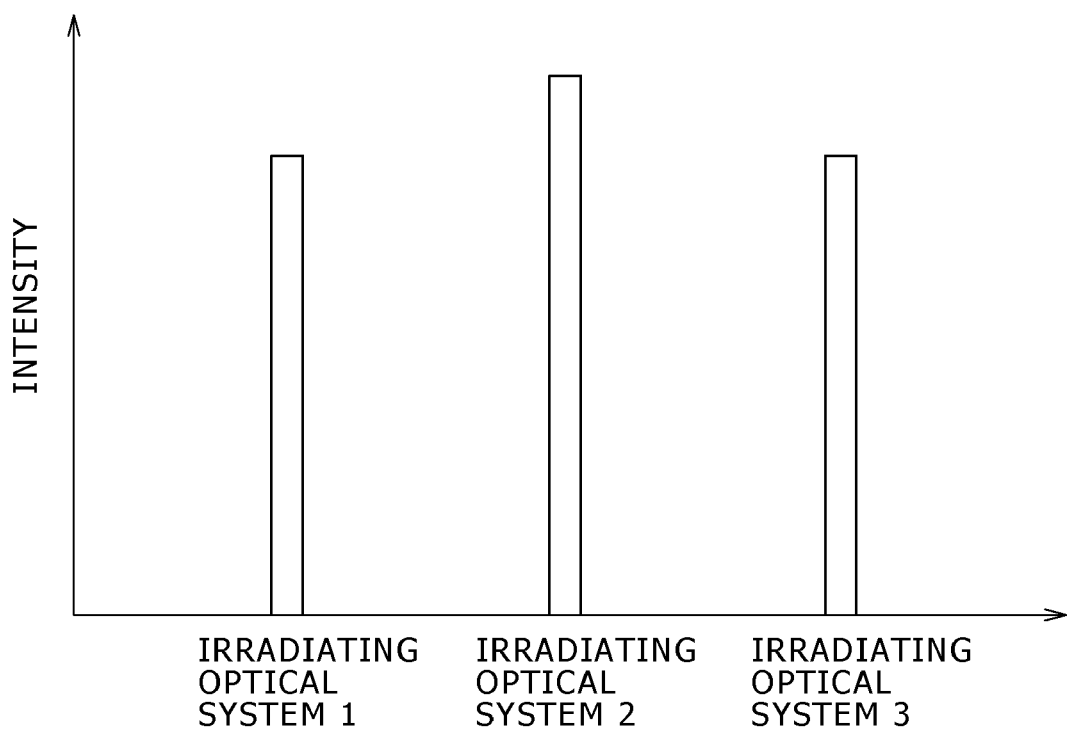
FIGS. 15A and 15B are diagrams of assistance in explaining a problem of the laser annealing method represented in FIG. 14.
Figure 15B:
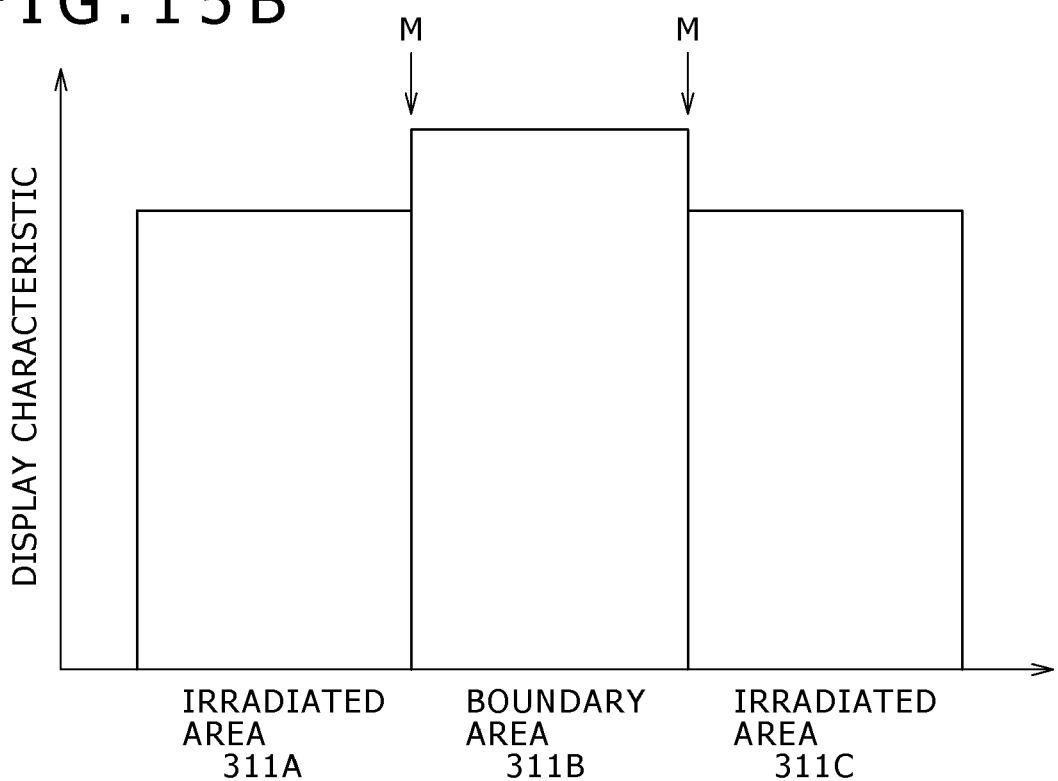

FIG. 13 is a diagram of assistance in explaining the third concrete example of pattern division in more detail. FIG. 13 illustrates a case where pattern division is performed such that for element forming areas 400 arranged in the form of a matrix, irradiation of one side of each element forming area 400 with the beam from the irradiating optical system 110A and irradiation of another side of each element forming area 400 with the beam from the irradiating optical system 110B are both performed in parallel with each other, three element forming areas 400 forming a repetitive structure of the three colors of R, G, and B are treated as one unit, a certain unit has a TFT forming area 401 at a position to be irradiated with the beam from the irradiating optical system 110B, another unit has a TFT forming area 401 at a position to be irradiated with the beam from the irradiating optical system 110A, and the change of the arrangement is alternately repeated in each unit.

Suppose that a mode of changing the arrangement of such TFT forming areas 401 is determined in advance in a stage of pixel design. When the mode of changing the arrangement of such TFT forming areas 401 is determined in a stage of pixel design, it is possible to deal readily with a change or a modification in wiring structure which change or modification is involved in changing the arrangement of the TFT forming areas 401. Incidentally, it suffices to use publicly known techniques to realize the changing of the arrangement of the TFT forming areas 401, that is, the arrangement of TFT forming areas 401 on the side of the single area 11A or the arrangement of TFT forming areas 401 on the side of the single area 11B, and therefore description thereof will herein be omitted.

Also when such a pattern division is performed, the presence of the boundary area 12AB alleviates a difference in intensity between the laser beams LB of the single areas 11A and 11B. Therefore boundaries between the single areas 11A and 11B and the boundary area 12AB become less visible. It is thus possible to manufacture an organic EL display device that suppresses display nonuniformity caused by difference in luminance and thereby achieves high display quality. In addition, it does not demand on/off switching control or shielding/non-shielding switching control on the laser beams LB, for example.

While a case where irradiation with each beam in the boundary area 12AB is performed on every other line (for example ABABAB . . . ) has been taken as an example, irradiation with each beam in the boundary area 12AB may be performed at intervals of a plurality of lines (for example at intervals of two lines as in ABBAAB . . . ).

In addition, while each element forming area 400 divided into a TFT forming area 401 and a capacitance forming area 402 has been described above, when there is a TFT that may be varied in characteristic within a pixel circuit, the TFT may be disposed in the capacitance forming area 402.

Further, a case where units in which TFT forming areas 401 are disposed on one side of element forming areas 400 and units in which TFT forming areas 401 are disposed on another side of element forming areas 400 are axisymmetric with respect to an axis in a beam scanning direction has been taken as an example. However, this is not necessarily demanded. More specifically, while at least channel parts of TFTs are desirably disposed axisymmetrically, other elements and patterns do not need to be disposed axisymmetrically as long as the channel parts of the TFTs are included in an energy beam irradiation width.

While the present invention has been described above by citing embodiments thereof, the present invention is not limited to the foregoing embodiments, and various modifications can be made.

For example, while in the foregoing embodiments, description has been made of a case where the irradiating optical systems 110A to 110C and the single areas 11A to 11C are equal to each other in number, the irradiating optical systems and the single areas do not necessarily need to be equal to each other in number. However, when the irradiating optical systems and the single areas are not equal to each other in number, two single areas adjacent to each other with one boundary area between the single areas are desirably irradiated with laser beams from irradiating optical systems different from each other.

In addition, while in the foregoing embodiments, an example has been taken in which the element forming area 400 is divided into the two parts of the TFT forming area 401 and the capacitance forming area 402, as long as at least one TFT forming area of which characteristic uniformity is demanded within a pixel is divided in an upper part or a lower part within the pixel, other elements may be in any arrangement.

Further, the present invention is applicable to cases where energy beams other than laser beams, such as electron beams, infrared rays, various lamps and the like, are used in the annealing process.

Further, for example, the materials and thickness of the respective layers described in the foregoing embodiments, or film forming methods, film forming conditions and the like are not limited, and other materials and other thickness may be used, or other film forming methods and other film forming conditions may be used.

In addition, while in the foregoing embodiments, concrete description has been made of the constitution of the organic EL elements 250R, 250B, and 250G, the organic EL elements do not need to have all the layers and may further include another layer.

Further, while in the foregoing embodiments, description has been made of a case where the driving panel 210 and the sealing panel 220 are laminated to each other throughout the screen with the adhesive layer 230 interposed between the driving panel 210 and the sealing panel 220, the present invention is applicable to cases where the adhesive layer 230 is formed on only a part of the driving panel 210 and the sealing panel 220, such for example as a case where the adhesive layer is formed on only a peripheral part of the driving panel 210, and the sealing panel 220 or the like is laminated to the adhesive layer.

In addition, the present invention is applicable to display devices using not only organic EL elements but also other display elements such as inorganic electroluminescent elements, liquid crystal display elements, electrodeposition type or electrochromic type display elements, or the like.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device manufacturing method for performing an annealing process of irradiating a semiconductor film on which element forming areas including thin film transistor forming areas are arranged in a two-dimensional pattern with energy beams using a plurality of irradiating optical systems, said method comprising:
    irradiating an area of said semiconductor film into thin film transistor forming areas, wherein each of said plurality of irradiating optical systems forms a thin film transistor forming area with an energy beam singly;
    forming a boundary area of said semiconductor film between an adjacent pair of said thin film transistor forming areas, each of the adjacent pair corresponding to a respective irradiating optical system of the plurality of irradiating optical systems; and
    irradiating said boundary area into a first irradiation part by one of said respective irradiating optical systems singly and a second irradiation part by the other of said respective irradiating optical systems singly,
    wherein,
        said first irradiation part and said second irradiation part are mixed with each other in each of two-dimensional directions in said boundary area.

2. The semiconductor device manufacturing method according to claim 1, wherein the irradiation of said boundary area includes:
    varying a distribution density of the first irradiation part and the second irradiation part in a direction orthogonal to a boundary line between one of said thin film transistor forming areas of said adjacent pair and said boundary area.

3. The semiconductor device manufacturing method according to claim 1, wherein the irradiation of said boundary area includes:
    performing an on/off switching of said respective beam irradiations to provide a mix of said first irradiation part and said second irradiation part in said boundary area.

4. The semiconductor device manufacturing method according to claim 1, wherein the irradiation of said boundary area includes:
    performing a shielding/non-shielding switching of respective energy beams to provide a mix of said first irradiation part and said second irradiation part in said boundary area.

5. The semiconductor device manufacturing method according to claim 1, wherein the irradiation of said boundary area includes:
    providing an arrangement of said thin film transistor forming areas to be at different positions with respect to said respective element forming areas to provide a mix of said first irradiation part and said second irradiation part in said boundary area.

* * * * *